US006596645B2

United States Patent
Kwon

(10) Patent No.: US 6,596,645 B2
(45) Date of Patent: Jul. 22, 2003

(54) METHOD FOR MANUFACTURING A SEMICONDUCTOR MEMORY DEVICE

(75) Inventor: O-Sung Kwon, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/917,790

(22) Filed: Jul. 31, 2001

(65) Prior Publication Data

US 2002/0022375 A1 Feb. 21, 2002

(30) Foreign Application Priority Data

Jul. 31, 2000 (KR) ........................................ 2000-44401

(51) Int. Cl.$^7$ ........................................... H01L 21/302
(52) U.S. Cl. ........................ 438/711; 438/726; 438/704
(58) Field of Search ........................... 438/3, 238, 240, 438/253, 255, 396, 398, 706, 714, 732, 733, 726

(56) References Cited

U.S. PATENT DOCUMENTS

| | | | | |
|---|---|---|---|---|
| 5,838,111 A | * | 11/1998 | Hayashi et al. | 315/111.21 |
| 6,093,457 A | * | 7/2000 | Okumura et al. | 427/569 |
| 6,129,806 A | * | 10/2000 | Kaji et al. | 156/345 |
| 6,231,777 B1 | * | 5/2001 | Kofuji et al. | 216/71 |
| 6,261,406 B1 | * | 7/2001 | Jurgensen et al. | 156/345 |
| 6,306,247 B1 | * | 10/2001 | Lin | 156/345 |

\* cited by examiner

*Primary Examiner*—Matthew Smith
*Assistant Examiner*—Calvin Lee
(74) *Attorney, Agent, or Firm*—Pillsbury Winthrop LLP

(57) ABSTRACT

A method is provided for manufacturing a semiconductor memory device, particularly ferroelectric devices, in which an interlayer dielectric (ILD) layer formed on an upper part of a semiconductor substrate containing a capacitor structure is etched under conditions in which the plasma electron temperature is maintained in a range between 2.0 eV and 4.0 eV to open contact holes to expose the capacitor structure and thereby avoid degradation of the device characteristics.

2 Claims, 4 Drawing Sheets

METHOD FOR MANUFACTURING A SEMICONDUCTOR MEMORY DEVICE

FIELD OF THE INVENTION

The present invention relates to a method for manufacturing a semiconductor memory device and, more particularly, to a method for manufacturing a semiconductor memory device which is capable of preventing deterioration of the semiconductor memory device resulting from plasma etching.

DESCRIPTION OF THE PRIOR ART

A memory device provides a means for storing and retrieving data. Certain types of semiconductor memory devices, e.g., dynamic random access memory (DRAM) devices are characterized by small size, high reliability, commodity pricing and high speed operation.

In semiconductor memory devices utilizing a ferroelectric material as a capacitor dielectric, several approaches have been developed for overcoming the need to refresh the data as in a conventional DRAM and to achieve a large capacitance. A ferroelectric random access memory (FeRAM) is a type of nonvolatile memory device that can maintain stored information in a power-off state and can provide operating speeds comparable to those of conventional DRAMs.

Strontium bismuth tantalate, $SrBi_2Ta_2O_9$ (SBT), or lead zirconate titanate, $Pb(Zr_x, Ti_{1-x})O_3$ (PZT), are materials commonly used as the ferroelectric material in FeRAM devices. A ferroelectric material that has a dielectric constant on the order of $10^2$–$10^3$ at room temperatures and has two stable residual polarization states. These properties, therefore, render such ferroelectric materials suitable for use in nonvolatile memory devices. Nonvolatile memory devices utilizing ferroelectric materials input data by setting the orientation of the polarization by applying an electric field. Once the orientation of the residual or remnant polarization is set, the electric field may be removed without losing the digital data, i.e., the stored "1" or "0", stored in the FeRAM.

The process for manufacturing FeRAM devices utilizes fairly conventional DRAM methods including a first interlayer dielectric (ILD) oxide layer formed on a semiconductor substrate over a bottom structure, e.g., a transistor and a bottom electrode. A ferroelectric layer and a top electrode are sequentially laminated on the first ILD layer to form a capacitor and a second ILD oxide layer is formed over the whole structure to cover the capacitor. Finally, contact holes are formed to expose a portion of the top electrode and a portion of the bottom electrode for electrical connection.

Conventional plasma etch processes can utilize a variety of plasma generating devices, e.g., reactive ion etching (RIE), induced coupled plasma (ICP), electron cyclotron resonance (ECR) and transformer coupled plasma (TCP), to generate plasma having a high ion density $D_i$, a high electron density $D_e$ and capable of etching an oxide layer. The ferroelectric materials used in FeRAM devices are, however, fragile and easily damaged during the plasma etch process. Accordingly, the residual polarization $P_r$ and the coercive voltage $V_c$ are reduced and less uniform, changes that will, in turn, degrade the resulting FeRAM device reliability. To solve this problem, a recovery annealing process should be carried out after performing plasma dry etching.

FIG. 1A is a graph illustrating results achieved using the conventional plasma etching condition for etching an ILD oxide layer covering the capacitor in a FeRAM device. The electron temperature $T_e$ is relatively fixed, though the electron density $D_e$ and the ion density $D_i$ are increased in each of the plasma conditions 1, 2, 3 or 4 which are achieved by setting different process conditions, mainly modification of the injection gas flows.

FIGS. 1B and 1C are graphs showing the residual polarization $P_r$ and the coercive voltage $V_c$ change when an etching is carried out in the same condition of FIG. 1A. The cumulative probability, as reflected in FIGS. 1B and 1C, is the probability of getting specific ranges between a maximum value and a minimum value for dP and dV on the x-axis in accordance with the conditions 1, 2, 3 and 4 respectively. This is the cumulative probability means the probability of a specific value which is obtained between the minimum values and the maximum values under the conditions 1, 2, 3 and 4. As shown in FIGS. 1B and 1C, as $D_e$ and $D_i$ are increased, the $P_r$ and the $V_c$ are decreased. That is, a deterioration of the FeRAM capacitor characteristics is unavoidable by increasing of $D_e$ and $D_i$.

SUMMARY OF THE INVENTION

It is, therefore, an object of the present invention to provide a method for manufacturing a ferroelectric memory device that prevents deterioration of the ferroelectric capacitor characteristics induced by increased electron density $D_e$ and ion density $D_i$ during the ILD etching process to form an opening in the ILD layer and expose a portion of the ferroelectric capacitor.

In accordance with an aspect of the present invention, there is provided a method for manufacturing a semiconductor memory device, the method comprising the steps of forming an interlayer dielectric (ILD) layer on an upper part of a semiconductor substrate provided with a capacitor structure and etching the ILD layer to expose a portion of the capacitor structure under conditions in which the electron temperature of the plasma is maintained in a range between 2.0 eV and 4.0 eV.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1A:
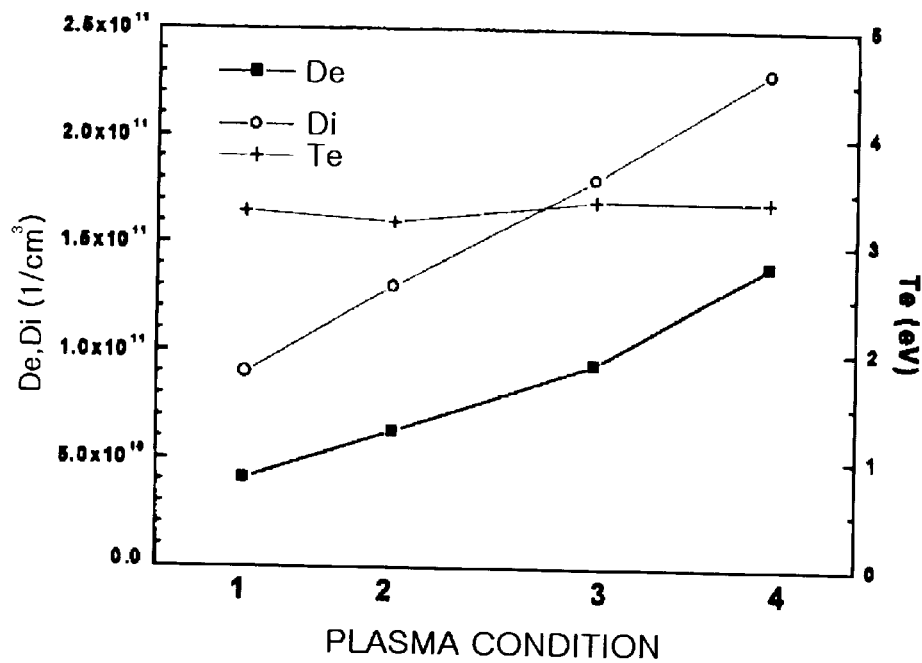
FIG. 1A is a graph illustrating a plasma etching condition in which an electron density $D_e$ and an ion density $D_i$ are changeable and an electron temperature $T_e$ is relatively fixed.
Figure 1B:
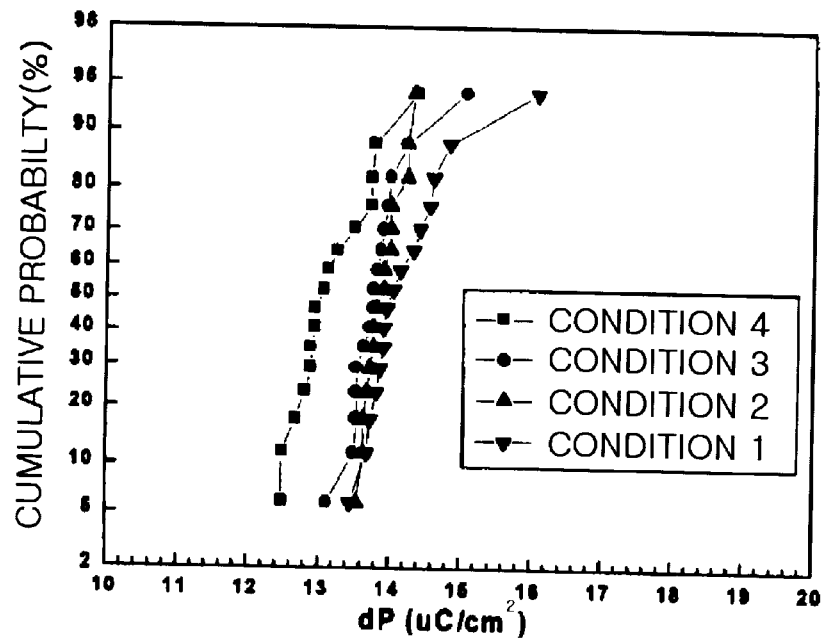
FIGS. 1B and 1C are graphs showing a residual polarization $P_r$ and a coercive voltage $V_c$ change, respectively, when they are etched in FIG. 1A condition.
Figure 1C:
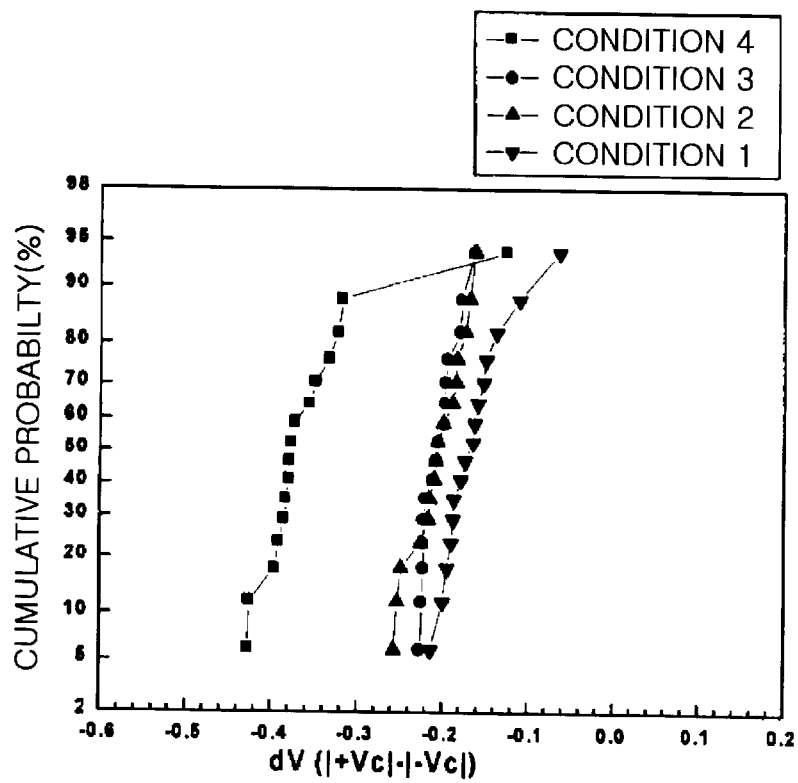
Figure 2A:
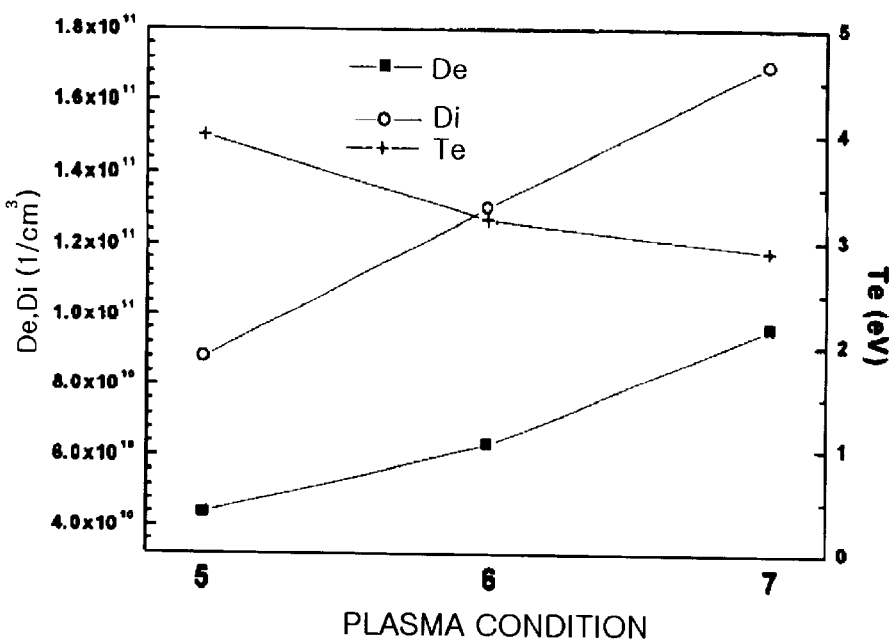
FIG. 2A is a graph showing a plasma etching condition in which the $T_e$, the $D_e$ and the $D_i$ are changed.
Figure 2B:
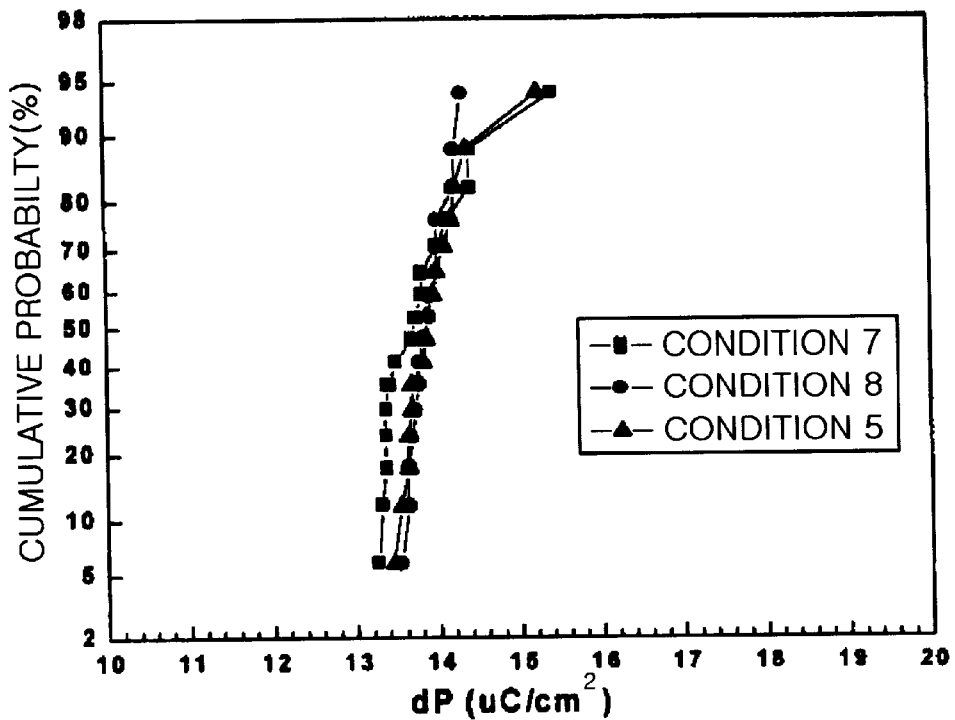
FIGS. 2B and 2C are graphs showing a residual polarization $P_r$ and a coercive voltage $V_c$ change, respectively, when they are etched in FIG. 2A condition.
Figure 2C:
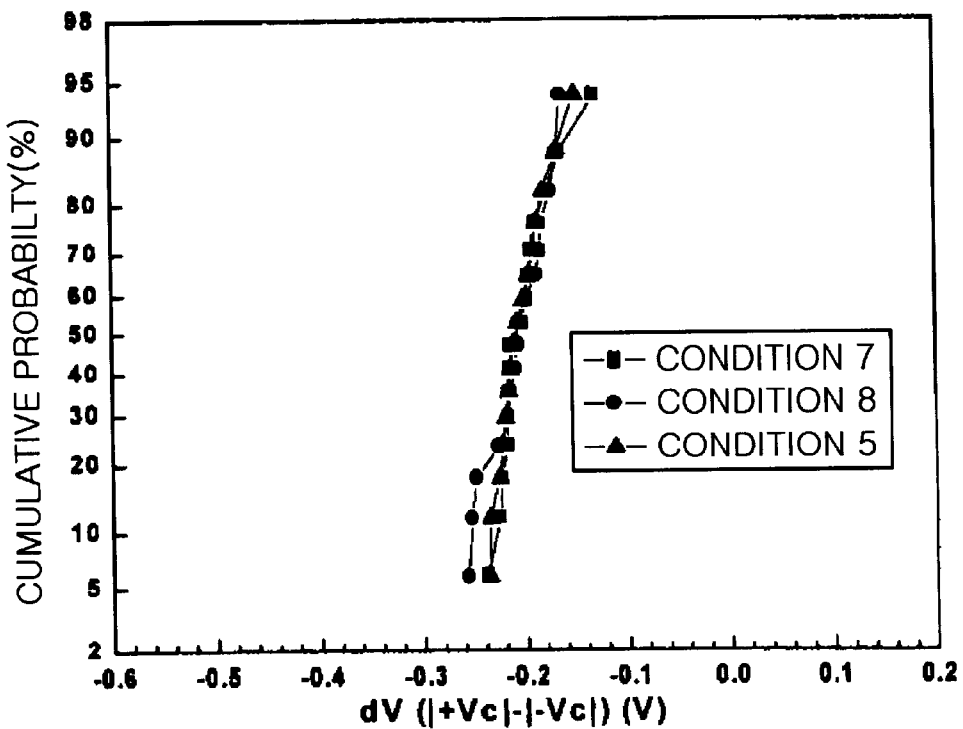

FIG. 2A is a graph showing plasma etching conditions 5, 6, 7 in which an electron temperature $T_e$, an electron density $D_e$ and an ion density $D_i$ are changed, wherein the $D_e$ and the $D_i$ are increased and the $T_e$ is decreased. FIGS. 2B and 2C are graphs showing $P_r$ and $V_c$ changes, respectively, when etching processes are carried out in response to the plasma etching conditions shown in FIG. 2A. As shown in FIGS. 2B and 2C, in spite of increasing the $D_e$ and the $D_i$, the present invention maintains the $P_r$ and the $V_c$ to predetermined values as the $T_e$ is decreased. That is, under conditions of constant or increased $D_e$ and $D_i$, the deterioration of the FeRAM ferroelectric capacitor characteristics induced by the plasma can be prevented by decreasing the $T_e$.

In order to maintain the $T_e$ of the plasma at a low temperature, various methods, e.g., increasing pressure, addition of another gas or gases, and/or a plasma pulse can be used.

Figure 3:
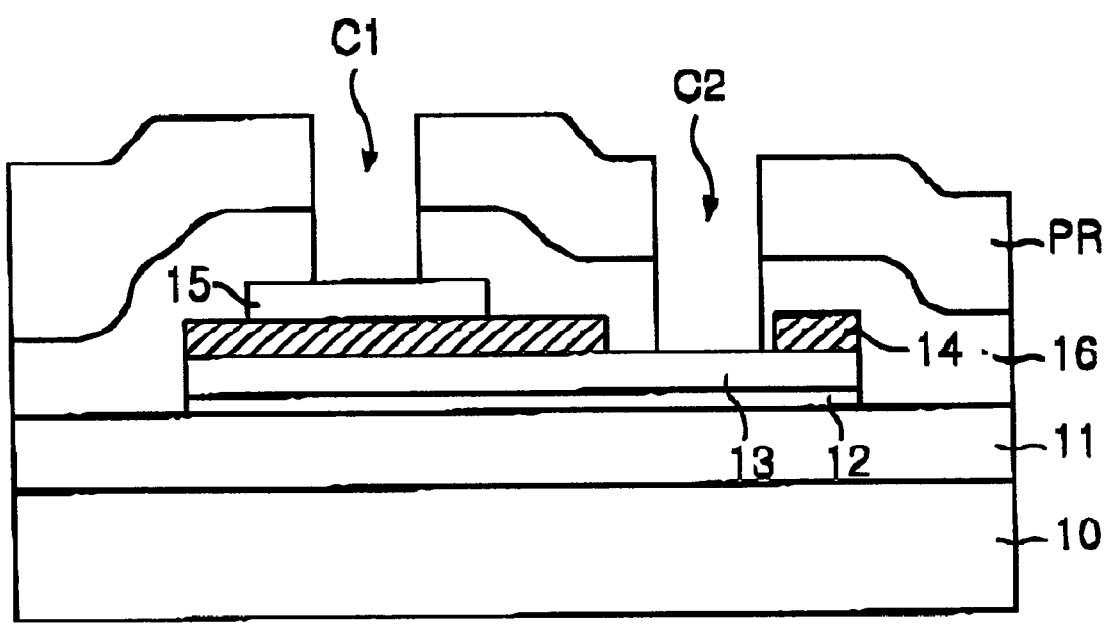
FIG. 3 is a cross-sectional view showing a FeRAM device which is manufactured by a method of the present invention.

Referring to FIG. 3, there is shown a method for manufacturing the FeRAM device in detail in accordance with the preferred embodiment of the present invention.

The method begins with preparing a semiconductor substrate 10 provided with a bottom structure (not shown). A first interlayer dielectric (ILD) oxide layer 11, a $TiO_2$ adhesive layer 12, a bottom electrode 13, a ferroelectric layer 14 and a top electrode 15 are successively formed on the semiconductor substrate 10 and then patterned and etched into a predetermined configuration to form a capacitor. A second ILD oxide layer 16 is then formed on the capacitor and the semiconductor substrate 10. A photosensitive layer pattern PR is formed to define a first contact hole opening C1 to expose a portion of the top electrode 15 and a second contact hole opening C2 to expose a portion of the bottom electrode 13 of the capacitor. The second ILD oxide layer 16 is then etched using the PR as an etching mask, whereby the C1 and the C2 contact holes are formed, respectively. The bottom electrode 13 and the top electrode 15 preferably comprise a layer of Pt or Ir, and the ferroelectric layer 14 is preferably formed from SBT or BST.

The second ILD oxide layer 16 which is not covered with the PR is removed by a dry etching process to form the C1 and the C2 contact holes wherein the dry etching utilizes a plasma. At this time, a gas which including C, F and H are used as a main etching gas and the etching progress is performed 20 mTorr pressure to decrease the $T_e$. Also, the $T_e$ can be decreased by using a plasma pulse.

According to the preferred embodiment of the present invention, the second ILD oxide layer 16 is etched on condition that maintaining the $D_i$ in a range from $8.5 \times 10^{10}/cm^3$ to $1.7 \times 10^{11}/cm^3$, the $D_e$ in a range from $4.5 \times 10^{10}/cm^3$ to $1.0 \times 10^{11}/cm^3$ and the $T_e$ in a range between 2.0 eV to 4.0 eV.

In the course of manufacturing FeRAM devices, the plasma which is used in the dry etching process tends to deteriorate the device characteristics to a significant degree, making it necessary to use a subsequent heat treatment to recover the desired electrical characteristics. The plasma used in the present invention is capable of decreasing the electron temperature $T_e$ during the oxide layer etching process for the FeRAM device. When an etching is carried out in a plasma that can decrease the $T_e$, it prevents problems resulting from a residual polarization $P_r$ reduction and coercive voltage $V_c$ changes by minimizing or eliminating etch damage. Therefore, the oxide layer can be etched properly without the need for a subsequent heat treatment.

The present invention is capable of preserving the desirable ferroelectric capacitor characteristics by preventing deterioration of the FeRAM device during oxide etch by applying a plasma having a reduced $T_e$, thereby improving the process margin.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device having a capacitor structure with a ferroelectric layer formed on a semiconductor substrate, the method comprising:

a) forming an interlayer dielectric (ILD) layer on an upper part of the semiconductor substrate and an upper part of the capacitor structure;

b) forming an etch mask on the ILD layer, the etch mask exposing a portion of the ILD layer above the capacitor structure; and c) removing the exposed portion of the ILD layer to expose a portion of the upper part of the capacitor structure using a plasma, the plasma being characterized by an electron temperature between 2.0 eV and 4.0 eV, an ion density between $8.5 \times 10^{10}/cm^3$ to $1.7 \times 10^{10}/cm^3$, an electron density between $4.5 \times 10^{10}/cm^3$ to $1.0 \times 10^{10}/cm^3$ and a pressure of at least 20 mTorr.

2. The method of claim 1, wherein the ILD layer is etched using a plasma pulse.

* * * * *